(12) United States Patent
Wyrzykowska et al.

(10) Patent No.: US 6,936,502 B2
(45) Date of Patent: Aug. 30, 2005

(54) PACKAGE MODIFICATION FOR CHANNEL-ROUTED CIRCUIT BOARDS

(75) Inventors: Aneta Wyrzykowska, Kanata (CA); Herman Kwong, Kanata (CA); Luigi Difilippo, Kanata (CA)

(73) Assignee: Nortel Networks Limited, St. Laurent ( * ) Notice: Subject to any disclaimer, the term of this patent is extended or adjusted under 35 U.S.C. 154(b) by 0 days.

(21) Appl. No.: 10/437,006

(22) Filed: May 14, 2003

(65) Prior Publication Data

US 2004/0226742 A1 Nov. 18, 2004

(51) Int. Cl.[7] .............................. H01L 21/60; H05K 3/32
(52) U.S. Cl. ............................ 438/125; 29/835; 29/837
(58) Field of Search ........................ 438/125; 257/697, 257/738, 774, 775, 786, E23.015, E23.036, E23.067; 361/773, 777, 786, 791; 29/835, 837; 174/260, 262

(56) References Cited

U.S. PATENT DOCUMENTS

| | | | | |
|---|---|---|---|---|
| 4,082,394 A | * | 4/1978 | Gedney et al. | ............... 439/69 |
| 4,530,002 A | * | 7/1985 | Kanai | ........................ 257/697 |
| 5,281,151 A | | 1/1994 | Arima et al. | |
| 5,451,721 A | | 9/1995 | Tsukada et al. | |
| RE35,064 E | * | 10/1995 | Hernandez | ................... 361/763 |
| 5,686,764 A | | 11/1997 | Fulcher | |
| 5,743,004 A | * | 4/1998 | Chobot et al. | ................ 29/830 |
| 5,768,109 A | * | 6/1998 | Gulick et al. | ................ 361/794 |
| 6,137,061 A | * | 10/2000 | Aponte et al. | .............. 174/260 |
| 6,243,272 B1 | * | 6/2001 | Zeng et al. | .................. 361/760 |
| 6,388,890 B1 | | 5/2002 | Kwong et al. | |
| 2003/0196831 A1 | * | 10/2003 | Momokawa | ................. 174/251 |

* cited by examiner

*Primary Examiner*—Stephen W. Smoot
(74) *Attorney, Agent, or Firm*—Hunton & Williams LLP (57) ABSTRACT

A method for implementing a circuit component on a surface of a multilayer circuit board is provided. The circuit component includes a plurality of pins and the circuit board includes a plurality of electrically conductive vias penetrating at least one layer of the circuit board and being arranged so as to form at least one channel for routing one or more traces at one or more signal layers of the circuit board. The method comprises the step of forming at least one pin of the plurality of pins of the circuit component to have a length compatible with a depth of a corresponding via of the circuit board.

7 Claims, 9 Drawing Sheets

Fig. 3E

PACKAGE MODIFICATION FOR CHANNEL-ROUTED CIRCUIT BOARDS

FIELD OF THE INVENTION

The present invention relates generally to multilayer circuit boards and, more particularly, to a technique for implementing through hole-based circuit components in multilayer circuit boards having channel routing.

BACKGROUND OF THE INVENTION

The limitations inherent to single signal layer printed circuit boards (PCBs) have led to the development of multilayer PCBs. Such multilayer PCBs may be either single or double-sided and may have multiple signal layers on the surface of and buried within the multilayer PCBs.

While the number of layers that may be provided by a multilayer PCB is theoretically unlimited, problems occur when the number of layers in a multilayer PCB exceeds a reasonable number, particularly when trying to route high-speed electrical signals between electronic components. For example, when making electrical connections between different layers in multilayer PCBs, electrically conductive vias generally are used. While these electrically conductive vias allow direct vertical electrical connections to be made between different layers within a multilayer PCB, there are intrinsic parasitics associated with these electrically conductive vias that can adversely affect the performance of signals propagating therethrough. That is, these electrically conductive vias have intrinsic parasitic resistance, capacitance, and inductance which can adversely affect signals propagating along each electrically conductive via. In addition, these intrinsic parasitics can also have an adverse effect on the manufacturability of a PCB and thus the cost thereof. Because of their adverse affect on signal performance, these intrinsic parasitics can also limit the bandwidth of signals propagating along each electrically conductive via. These adverse affects only increase as the number of layers in a multilayer PCB increase.

Due to the adverse effects on signal integrity as the layer count of a PCB increase, techniques have been developed to provide for "channel routing" within a PCB to reduce the number of layers necessary to provide the requisite electrical connections. An exemplary channel routing technique is described in U.S. Pat. No. 6,388,890 issued on May 14, 2002 to Kwong et al., the entirety of which is hereby incorporated by reference herein. Kwong et al. disclose a technique for manufacturing and using a PCB wherein certain vias extend only through a subset of the layers of the PCB to create channels in the portions of the PCB where vias are absent. These channels then may be used to route a larger number of signal, power, ground and/or test traces between vias thereby reducing the number of layers necessary to provide a certain number of electrical connections.

While reducing the requisite number of signal layers, conventional channel routing techniques typically are limited to surface mount devices (SMDs), e.g., ball grid array (BGA) packages. Through hole-based devices (THDs), such as pin grid array (PGA) packages, generally have pins of a pre-determined length that may be incompatible with the reduced-depth vias used in PCBs having channel routing. As a result, THDs and other devices having pins of a uniform length often cannot be utilized in channel-routed PCBs and therefore are utilized with other types of PCBs that require a greater number of signal layers. This increased number of requisite signal layers may then create or magnify the adverse signal effects caused by an increased number of layers, as described above.

In view of the foregoing, it would be desirable to provide a technique for implementing a THD and other pin-based packages in a multilayer channel routed PCB.

SUMMARY OF THE INVENTION

A method for implementing a circuit component on a surface of a multilayer circuit board is provided in accordance with one embodiment of the present invention. The circuit component includes a plurality of pins and the circuit board includes a plurality of electrically conductive vias penetrating at least one layer of the circuit board and being arranged so as to form at least one channel for routing one or more traces at one or more signal layers of the circuit board. The method comprises the step of forming at least one pin of the plurality of pins of the circuit component to have a length compatible with a depth of a corresponding via of the circuit board.

In accordance with another embodiment of the present invention, there is provided a circuit component for use with a multilayer circuit board having a plurality of electrically conductive vias penetrating at least one layer of the circuit board and being arranged so as to form at least one channel for routing one or more traces at one or more signal layers of the circuit board. The circuit component comprises a plurality of pins corresponding to the plurality of vias of the multilayer circuit board, each pin having a length compatible with a depth of the corresponding via.

In accordance with yet another embodiment of the present invention, a circuit device is provided. The circuit device comprises a multilayer circuit board having a plurality of electrically conductive vias penetrating at least one layer of the circuit board and being arranged so as to form at least one channel for routing one or more traces at one or more signal layers of the circuit board. The circuit device further comprises a circuit component mounted to a surface of the circuit board and having a plurality of pins corresponding to the plurality of vias, each pin extending into and in electrical contact with the corresponding via of the circuit board, wherein each of the plurality of pins of the circuit component has a length compatible with a depth of the corresponding via.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1A:
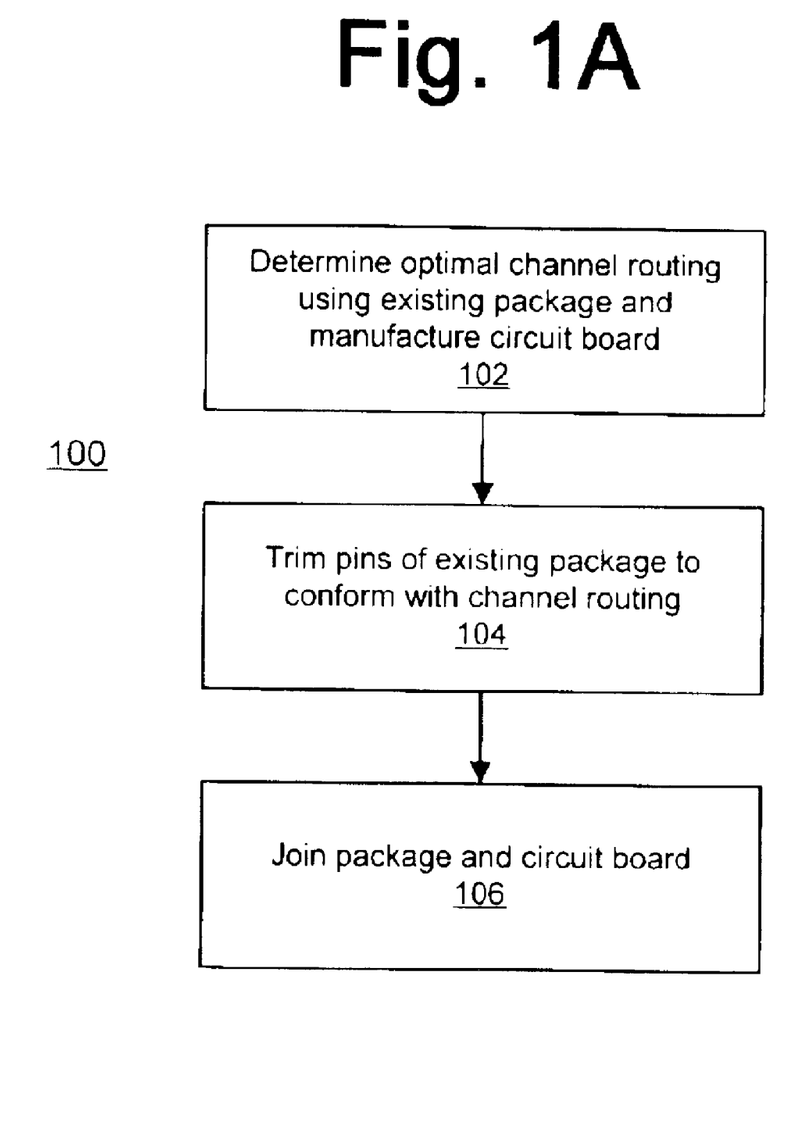
FIG. 1A is a flow diagram illustrating an exemplary method for creating a circuit device having a package modified to conform to a circuit board having channel routing in accordance with at least one embodiment of the present invention.
Figure 1B:
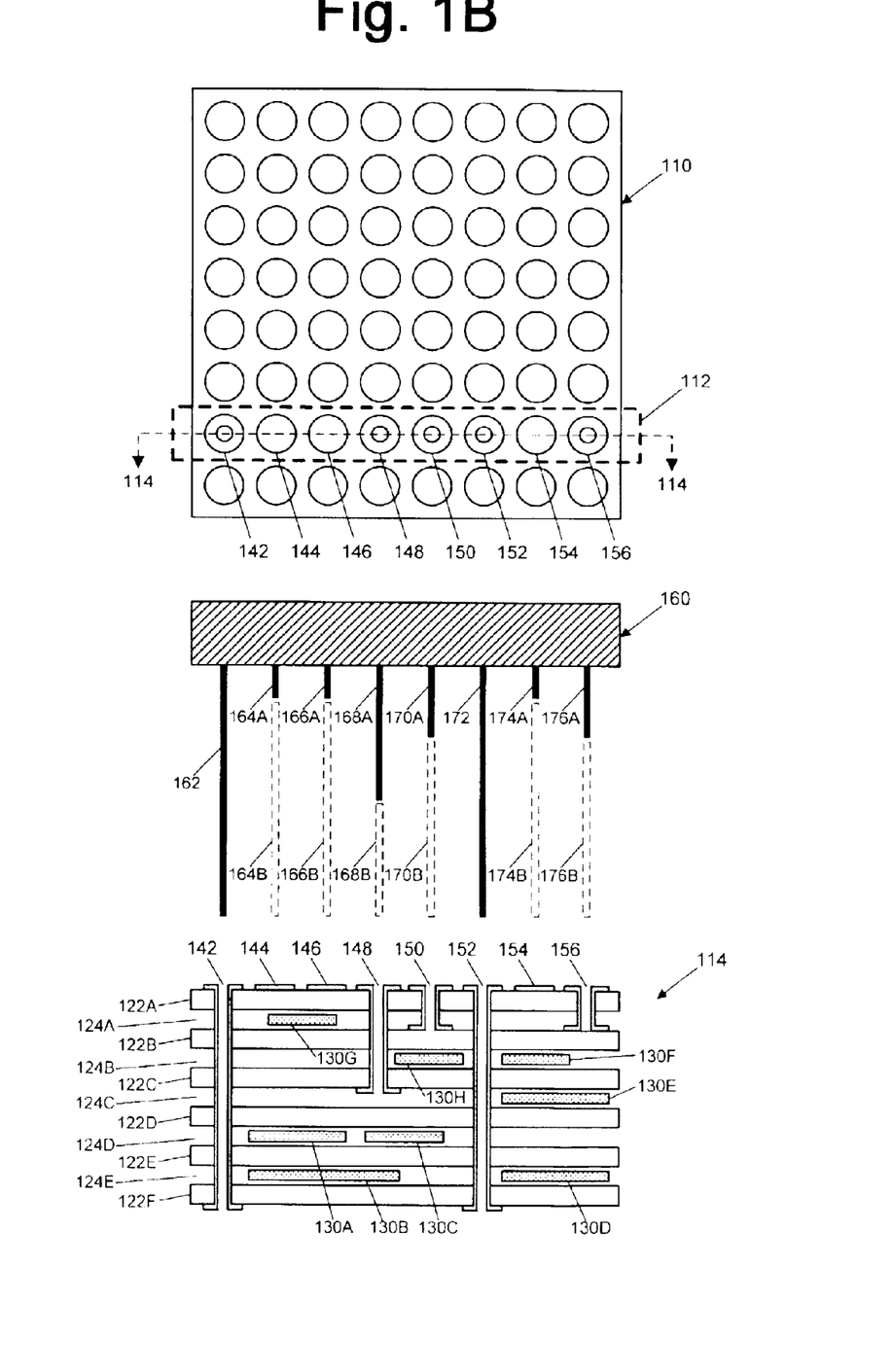
FIG. 1B is a schematic diagram illustrating a plan and cross-section view of an exemplary circuit board having channel routing and a cross section of an exemplary package having pins modified to conform to the circuit board in accordance with at least one embodiment of the present invention.
Figure 1C:
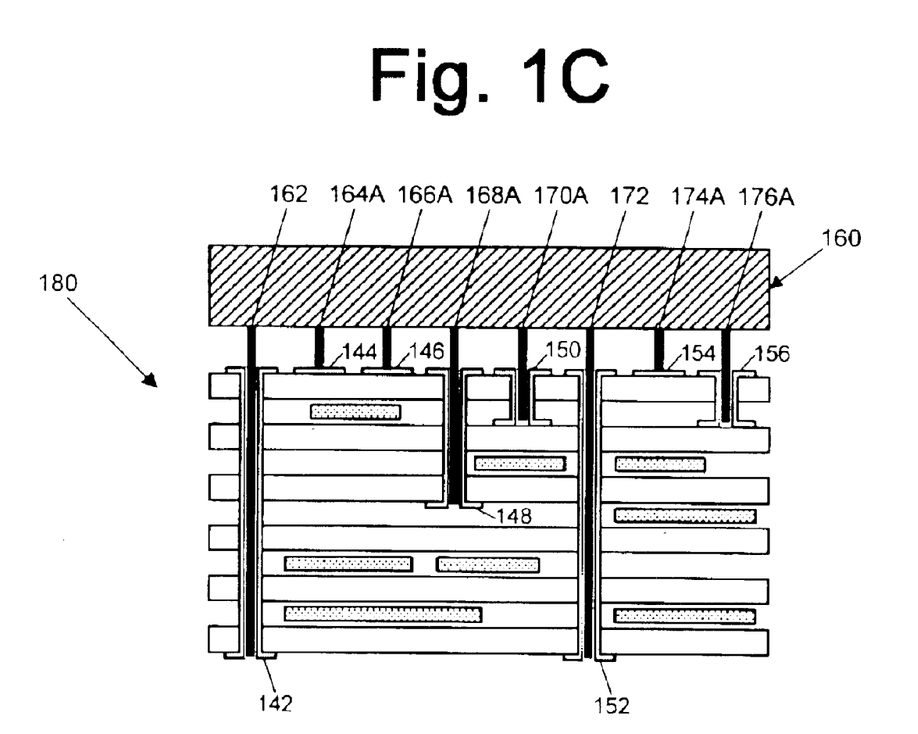
FIG. 1C is a schematic diagram illustrating a joining of the package and circuit board of FIG. 1B in accordance with at least one embodiment of the present invention.
Figure 2A:
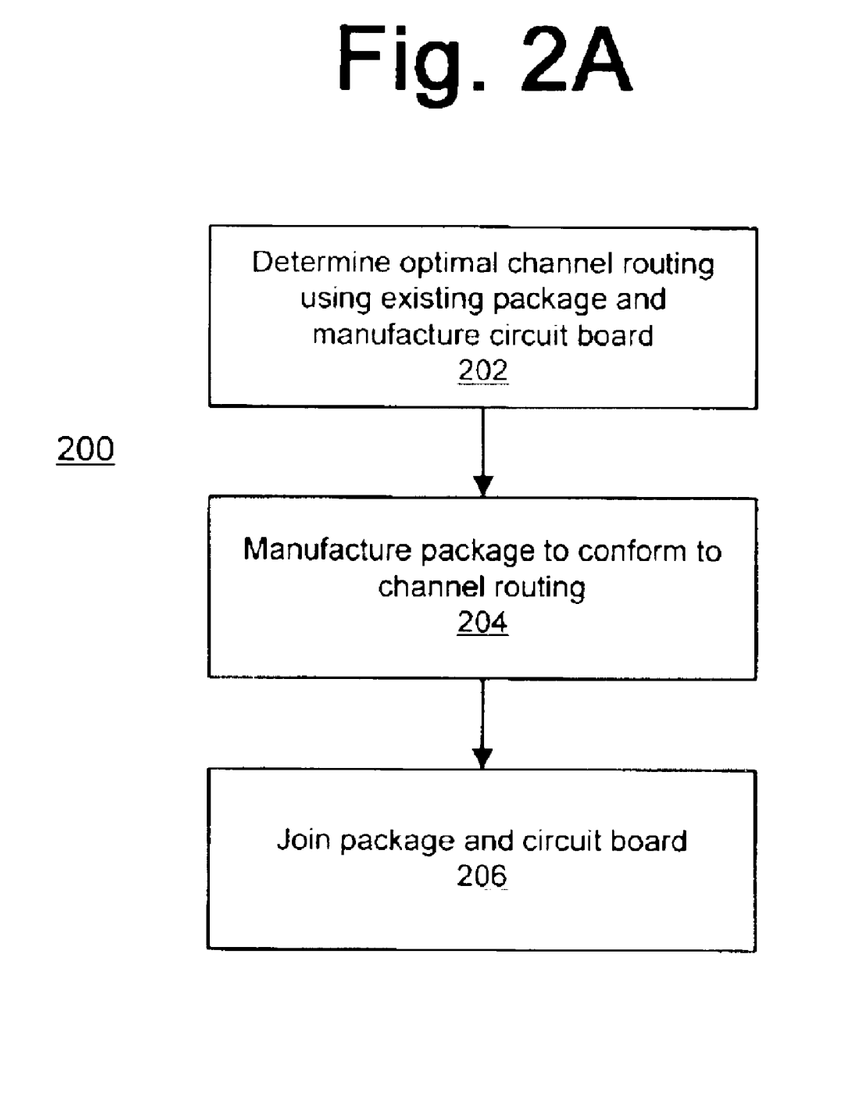
FIG. 2A is a flow diagram illustrating an exemplary method for creating a circuit device having a package manufactured to conform to a circuit board having channel routing in accordance with at least one embodiment of the present invention.
Figure 2B:
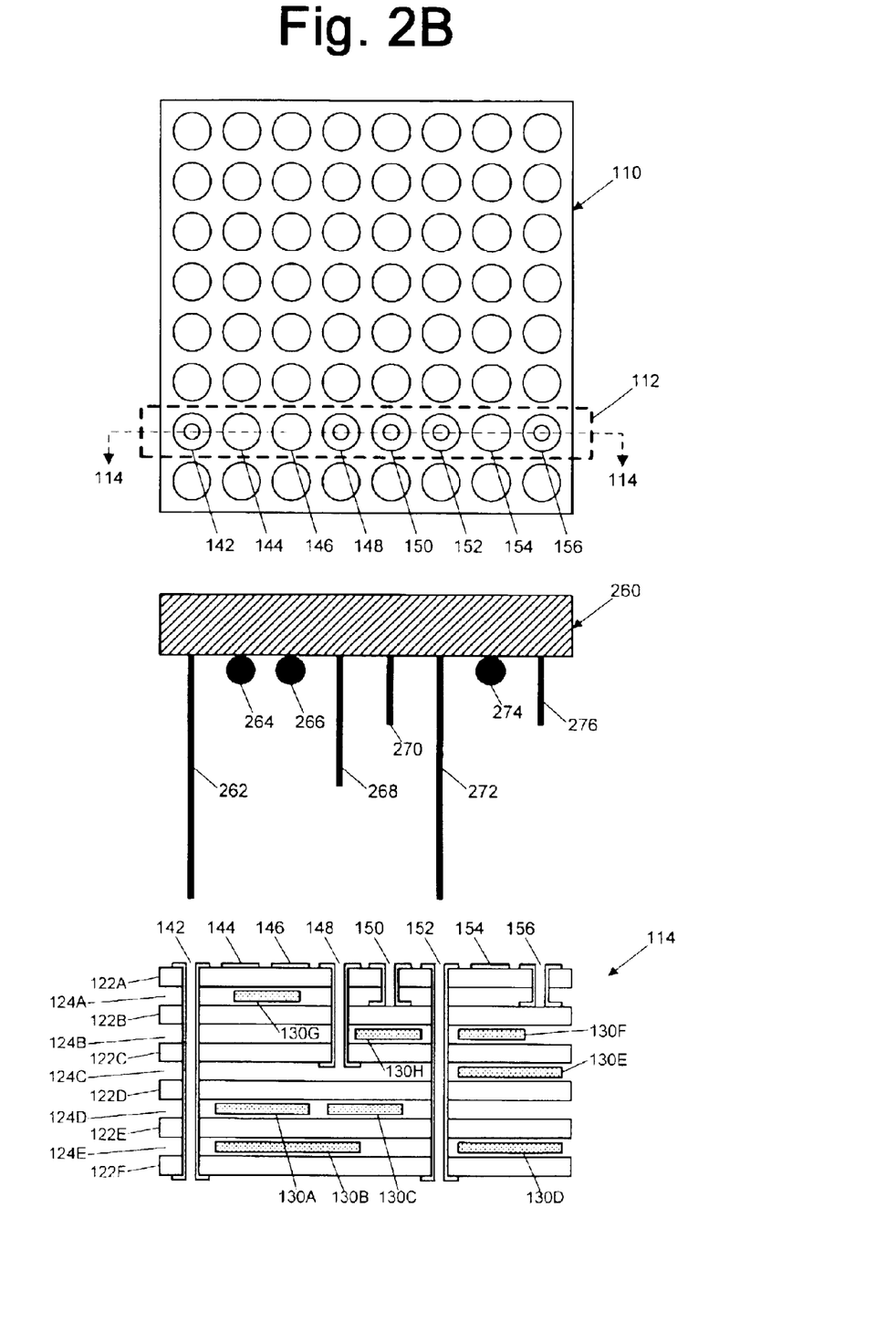
FIG. 2B is a schematic diagram illustrating a plan and cross-section view of an exemplary circuit board having channel routing and a cross section of an exemplary package having pins manufactured to conform with the circuit board in accordance with at least one embodiment of the present invention.
Figure 2C:
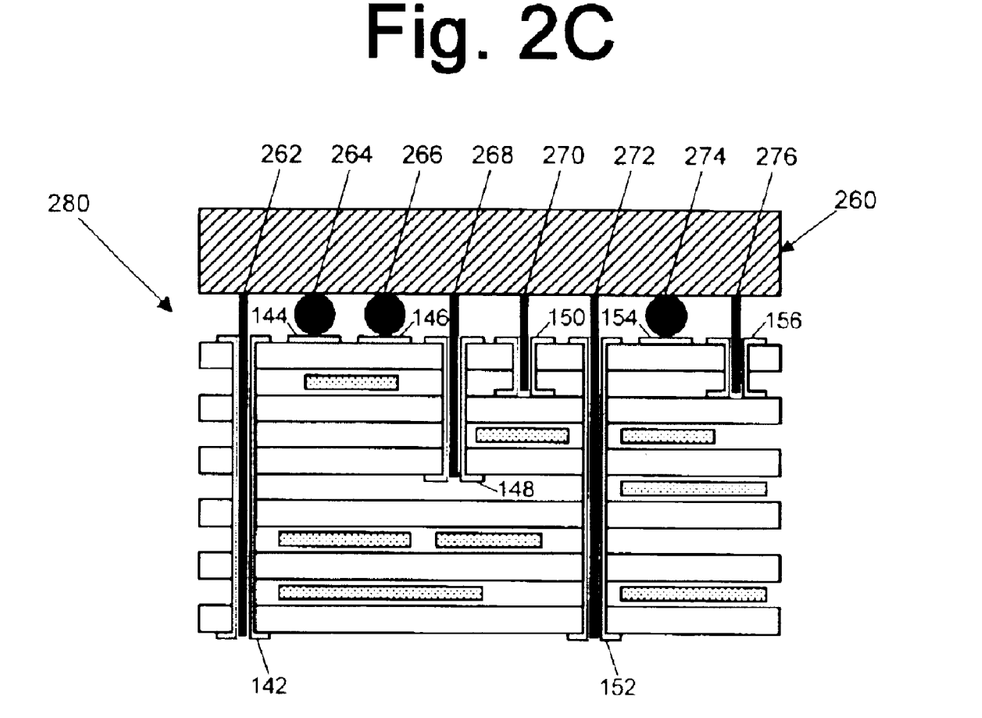
FIG. 2C is a schematic diagram illustrating a joining of the package and circuit board of FIG. 2B in accordance with at least one embodiment of the present invention.

FIG. 1A–2C illustrate various exemplary techniques for utilizing through hole and/or hybrid packages in devices having printed circuit boards (PCBs) with channel routing. FIG. 1A–1C illustrate an exemplary technique for modifying a pre-existing package to conform to a PCB having channel routing. As discussed in detail below, this modification may include the trimming of the pins/columns of the pre-existing package and/or replacing one pin type (i.e., a straight pin) with another pin type (e.g., a ball pin). FIGS. 2A–2C illustrate an exemplary technique for manufacturing a circuit pack to conform to a PCB having channel routing. As discussed below, the package may be manufactured to have pins of different lengths corresponding to their position on the PCB, to have pins of different types (e.g., columns and balls), or a combination thereof. FIGS. 3A–3E illustrate an exemplary technique for forming pins to have the different lengths and joining the pins to a package body to form a package for use in a PCB having channel routing.

Referring now to FIG. 1A–1C, a method 100 (FIG. 1A) for creating a circuit device with a PCB having channel routing and a package modified to conform to the channel routing and an exemplary circuit device 180 (FIG. 1C) created based on method 100 are illustrated in accordance with at least one embodiment of the present invention. For ease of illustration, FIGS. 1B and 1C illustrate an exemplary circuit device having a relatively small number of pins (64 pins). The techniques described herein, however, may be utilized in devices having any number of pins without departing from the spirit or the scope of the present invention.

The method 100 initiates at step 102 wherein a multilayer PCB 110 (FIG. 1B) is formed to provide signaling, power and/or testing leads that facilitate the operation of a package 160. The package 160 may include any of a variety of package types, such as, for example, a dual-inline package (DIP), a ball grid array (BGA) package, a column grid array (CGA) package, a pin grid array (PGA) package, a chip scale package (CSP), through hole array connectors, or a combination thereof (i.e., a "hybrid" package). In the illustrated example of FIG. 1B, the PCB 110 comprises alternating dielectric layers 122A–122F and conductive layers 124A–124E. Although PCB 110 is illustrated having a certain number of layers, a PCB having any number of layers may be implemented, as appropriate, using the guidelines provided herein.

In at least one embodiment, one or more channel routing techniques may be implemented to determine an optimal channel routing scheme for the PCB 110. The channel routing technique described by Kwong et al. preferably is used. As disclosed by Kwong et al., channels for routing signal traces (also referred to as lines or runs) may be formed by utilizing vias that only partially penetrate a PCB. The portions of the unpenetrated layers beneath the via, i.e., the channels, may then used to route signal traces. To illustrate, based on the desired functionality of the package 160, the exemplary PCB 110 having vias 142, 148, 150, 152, and 156 and surface pads 144, 146, 154 at row 112 may be formed as a result of one or more channel routing process such as the one disclosed by Kwong et al., where vias 142, 152 include a through hole penetrating through the entirety of the PCB 110 and blind vias 148, 150 and 156 include vias (e.g., microvias) that penetrate only a subset of the layers of the PCB 110. This exemplary configuration may provide for the formation of one or more channels at various layers of the PCB 110, such as, for example, channels 130A–130H. These channels 130A–130H then may be utilized to run traces at the corresponding layers of the PCB 110 as described by, for example, Kwong et al.

As will be appreciated, the cost and/or effort of utilizing a prefabricated package that conforms to the pad/via configuration of the PCB 110 may be prohibitive. Accordingly, the pins of the pre-existing package 160 may be modified at step 104 to conform with the corresponding surface pad or via of the PCB 110. The term pin may refer to any of a variety of conductive structures (e.g., "leads") used to provide an electrical connection between one or more electrical conduits of the PCB 110 and an input/output of the package 160. Examples of pins may include, but are not limited to, straight pins and metal (e.g., gold) dendrites pins, balls, columns, etc. To illustrate, the pins 162–176 of the package 160 that connect to the corresponding pad/via of row 112 of the PCB 110 may be trimmed such that the pins do not extend past the depth intended by the corresponding via. In instances wherein a pin of the package 160 is intended to provide electrical contact with a surface pad of the PCB 110 (e.g., pin 164A to contact pad 144), the "depth" of the surface pad may be represented as the distance between the bottom surface of the package 160 and the corresponding surface pad. The trimming of the pins 162–176 to be compatible with vias 142, 148–152, and 156 and surface pads 144, 146, and 154 may be accomplished as follows: portion 164B of pin 164 may be trimmed, leaving portion 164A; portion 166B of pin 166 may be trimmed, leaving portion 166A; portion 168B of pin 168 may be trimmed, leaving portion 168A; portion 170B of pin 170 may be trimmed, leaving portion 170A; portion 174B of pin 174 may be trimmed, leaving portion 174A; and portion 176B of pin 176 may be trimmed, leaving portion 176A.

In this example, it is assumed that pins 162, 172 have an original length that is compatible with the through holes 142, 152, respectively and therefore do not need to be trimmed to be compatible with the corresponding vias of the PCB 110.

Any of a variety of methods may be utilized to trim the pins 162–176. Such techniques may include, for example, trimming the pins to the desired length using a diamond saw or laser cutting device, grinding the pins down to their desired lengths, and the like.

In addition to or rather than trimming one or more of the pins 162–176 to be compatible with the corresponding via(s) and/or surface pads, the original pin may be replaced by another pin of a same or different type. To illustrate, a longer straight pin could be replaced by a column or a ball, a ball could be replaced by a column pin, etc. FIGS. 2B and 2C illustrate a hybrid package utilizing multiple pin types. Alternatively, rather than trimming a pin to a certain length, the original length pin could be replaced by a shorter length pin.

As illustrated by FIG. 1C, the package 160 having one or more modified pins may be joined to the PCB 110 at step 106 to form a circuit device 180 where the pins of the package 160 extend into and are in electrical contact with the corresponding via/contact pad of the PCB 110. Any of a variety of techniques for joining a package to a circuit board may be utilized to join the package 160 to the PCB 110. For example, solder reflow techniques may be utilized to provide an electrical and mechanical connection between the pins and their corresponding via/contact pad and contact adhesives may be used to provide a mechanical bond between the package 160 and the surface layer of the PCB 110.

As a result of the application of method 100 to the PCB 110 and the package 160, the circuit device 180 having a reduced number of layers compared to conventional fabrication techniques may be formed. Further, by providing for the modification of pre-existing packages to conform to the channel routing formed at least in part by the use of vias that only partially penetrate the PCB 110, as well as the presence of surface pads, packages that originally were intended for use in through hole PCBs may be utilized in channel routed PCBs.

Referring now to FIGS. 2A–2C, a method 200 (FIG. 2A) for creating a circuit device with a PCB having channel routing and a package manufactured to conform to the channel routing and an exemplary circuit device 280 (FIG. 2C) created based on method 200 are illustrated in accordance with at least one embodiment of the present invention. For ease of illustration, FIGS. 2B and 2C illustrate an exemplary device having a relatively small number of pins (64 pins). The techniques described herein, however, may be utilized in circuit devices having any number of pins without departing from the spirit or the scope of the present invention.

In many instances, it may be desirable to manufacture or fabricate a package having pins compatible with a PCB having channel routing rather than to modify a pre-existing package to conform to the PCB, as was discussed above with reference to FIG. 1. The manufacture of packages having the custom pin lengths typically results in an improved yield and reduced volume cost compared to the post-manufacture modification of a package having standard pins. Accordingly, method 200 illustrates an exemplary method wherein a "custom" package 260 (FIG. 2B) is manufactured to conform to a pre-existing PCB having a particular channel routing configuration rather than modifying an "off-the-shelf" package.

The method 200 initiates at step 202 wherein a PCB having channel routing is designed and manufactured to provide signal, power and/or test runs for use by a package to perform one or more desired functions. For ease of discussion, the PCB 110 of FIG. 1 is provided in FIG. 2 as an example of such a PCB. As discussed above with reference to step 102 of FIG. 1A, the channel routing method disclosed by Kwong et al. preferably is used to determine an appropriate channel routing configuration for the PCB 110. Other channel routing techniques may be used, as appropriate.

At step 204, a package 260 may be manufactured whereby the pins of the package 260 are compatible with the channel routing configuration of the PCB 110 as a result of the manufacturing process. In manufacturing the package 260, the pins of the package 260 may be formed having dimensions compatible with the PCB 110, such as a straight pin or column having a length compatible with the depth of a via, a ball having a diameter compatible with a surface pad of the PCB 110, etc.

Figure 3A:
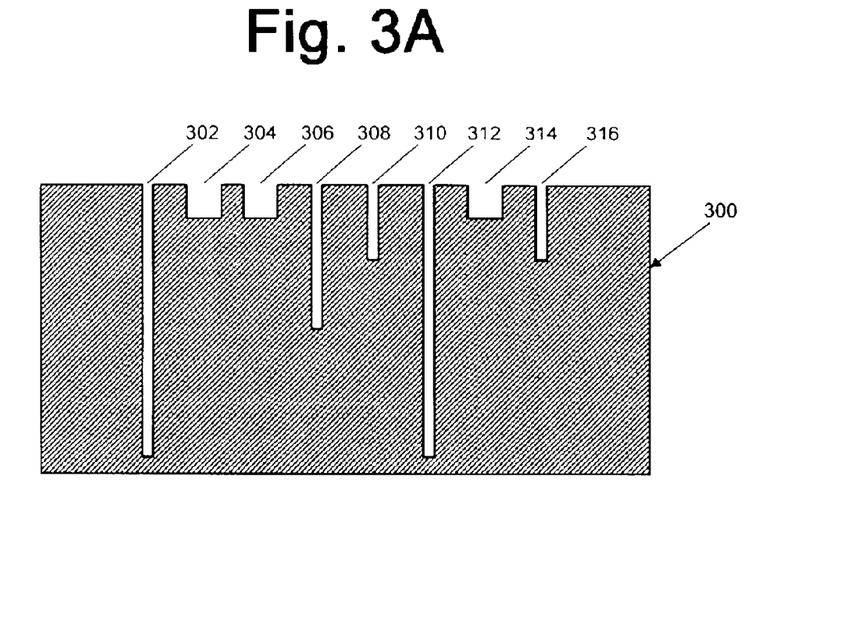
FIG. 3A is a schematic diagram illustrating a cross section view of an exemplary fixture used to form pins having certain lengths in accordance with at least one embodiment of the present invention.

The package 260 may be manufactured to include any of a variety of package types, such as, for example, a DIP package, a BGA package, a CGA package, a PGA package, a chip scale package (CSP), a flip chip, and the like. Alternatively, the package 260 may include a hybrid type, such as a combination of PGA and BGA pin types. In the illustrated example of FIG. 2B, the package 260 is a hybrid package formed having straight pins 262, 268, 270, 272, and 276 (analogous to pins 162, 168A, 170A, 172, and 176A, respectively, of FIG. 1B) and balls 264, 266, and 274 at the row of pins of the package 260 intended for row 112 of the PCB 110. An exemplary technique for forming a package having pins of various lengths is illustrated with reference to FIG. 3. Other techniques also may be used.

As illustrated by FIG. 2C, the package 260 having one or more modified pins may be joined to the PCB 110 at step 206 to form a circuit device 280. Any of a variety of techniques for joining a package to a circuit board may be utilized to join the package 260 to the PCB 110, as discussed above.

As a result of the application of method 200 to the PCB 110 and the package 260, a circuit device 280 having a reduced number of layers compared to conventional fabrication techniques may be formed. Further, by providing for the fabrication of custom packages to conform to the channel routing formed at least in part by the use of vias that only partially penetrate the PCB 110, modification of pre-existing packages that originally were intended for use in through hole PCBs may be unnecessary.

Referring now to FIGS. 3A–3E, an exemplary technique for forming pins to have different lengths corresponding to the vias/contact pads of a PCB having circuit routing is illustrated in accordance with at least one embodiment of the present invention. The following description describes an application of the disclosed technique to form a package analogous to package 260 (FIG. 2B) having balls and straight pins. Those skilled in the art may apply the trimming technique described herein to packages having similar or different configurations.

FIG. 3A illustrates a cross-section view of a fixture 300 at a section corresponding to row 112 of the PCB 110 (FIG. 1B). The fixture 300 may be constructed of any variety or any combination of materials, such as plastics, epoxy, metal, wood, and the like. In the illustrated example, the fixture 300 includes openings 302–316 for receiving pins to be incorporated into a package. Each of the openings 302–316 may be formed to have characteristics corresponding to the desired resulting pin. To illustrate, openings 302, 308–312 and 316 may be formed to secure straight pins, where each of openings 302, 308–312 and 316 has a depth equivalent to the desired length of the corresponding pin and a diameter sufficient to secure the pin without excess movement. Similarly, openings 304, 306 and 314 may be formed to accommodate balls, where the width and depth of the openings 304, 306 and 314 are sufficient to secure a ball without excess movement and where the balls do not substantially extend past the surface of the fixture 300.

Figure 3B:
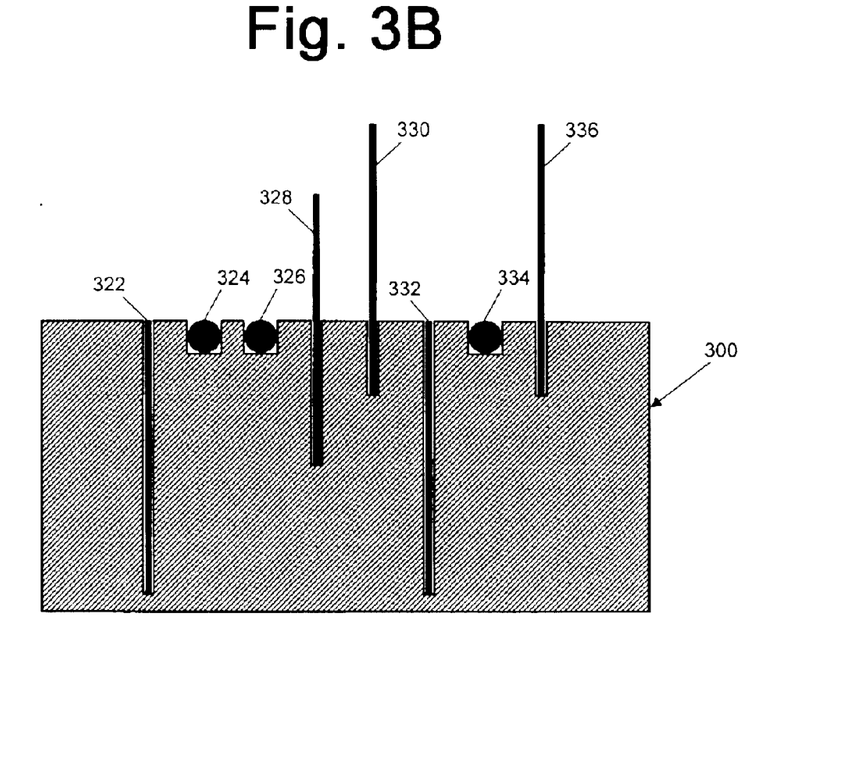
FIG. 3B is a schematic diagram illustrating a cross section view of the exemplary fixture of FIG. 3A having pins inserted in accordance with at least one embodiment of the present invention.

FIG. 3B illustrates the fixture 300 having pins 322–336 inserted into the corresponding openings 302–316, respectively. In the illustrated example, pins 322, 328, 330, 332 and 336 include straight pins of a uniform length, thereby reducing the cost and complexity of using the fixture. However, in other implementations, pins of different lengths may be used, for example, to prevent excess waste after trimming. The pins 324, 326 and 334 include balls in this example.

Figure 3C:
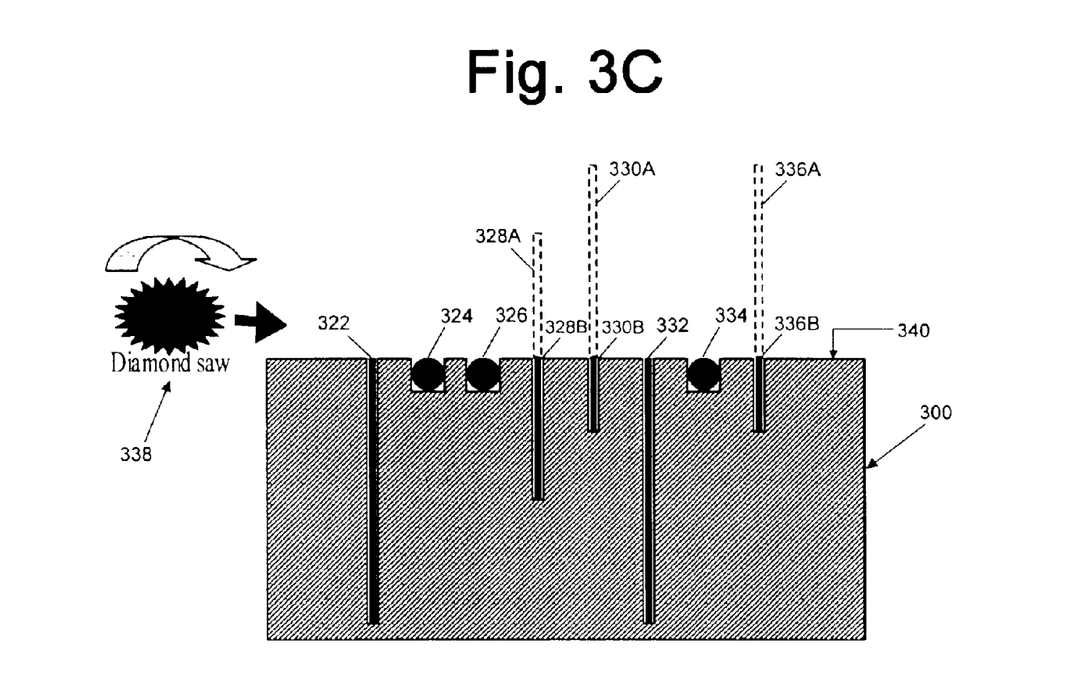
FIG. 3C is a schematic diagram illustrating an exemplary technique for trimming the pins inserted in the fixture of FIG. 3B in accordance with at least one embodiment of the present invention.

Referring to FIG. 3C, an exemplary technique for trimming of the pins 322–336 using the fixture 300 is illustrated. A cutting, shearing, or grinding device, such as a diamond saw 338 may be used to trim those portions of the pins 322–336 that substantially extend above the surface 340 of the fixture 300, where the surface 340 may be used as a guide by the cutting device. In the illustrated example, pin segments 328A, 330A, and 336A are trimmed from pins 328, 330 and 336, respectively, leaving pin segments 328B, 330B and 336B in the fixture 300. Because, in this example, straight pins 322 and 332 have a length equivalent to the depth of the openings in which they are located, no portion of the straight pins 322 and 332 extends above the surface 340 and therefore are not trimmed by the diamond saw 338. Likewise, the openings securing the balls 324, 326 and 334, in this example, have depths equivalent to the diameter of the balls 324, 326 and 334 and the balls 324, 326 and 334 therefore are not trimmed by the diamond saw 338.

Figure 3D:
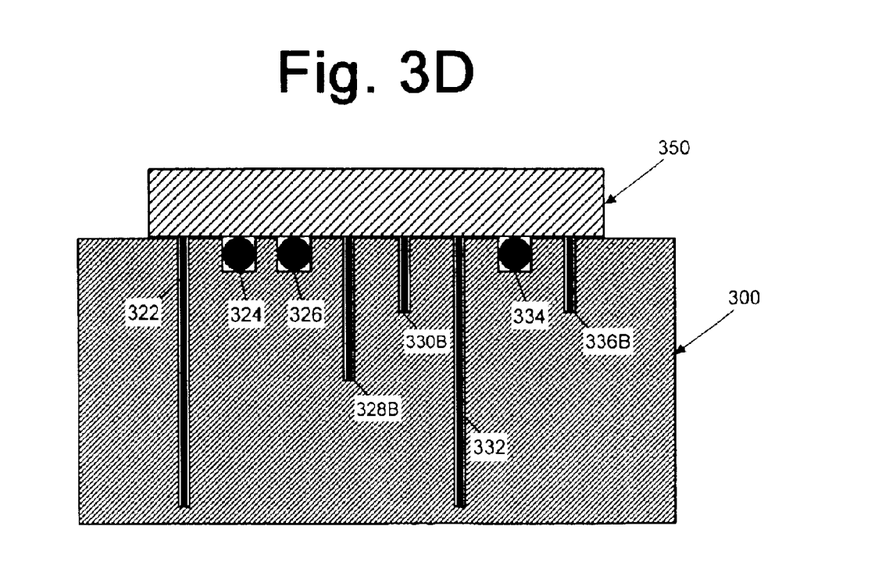
FIG. 3D is a schematic diagram illustrating an exemplary technique for joining a package body to the trimmed pins of FIG. 3C in accordance with at least one embodiment of the present invention.

As shown in FIG. 3D, a package body 350 incorporating the circuitry of the package 260 (FIG. 2B) may be placed on the surface 340 so that the input/outputs of the package body 350 align with the corresponding pins/pin segments 322, 324, 326, 328B, 330B, 332, 334 and 336B. The input/outputs of the package body 350 then may be electrically and mechanically joined to the corresponding pin/pin segments by soldering, applying conductive adhesives, and the like.

Figure 3E:
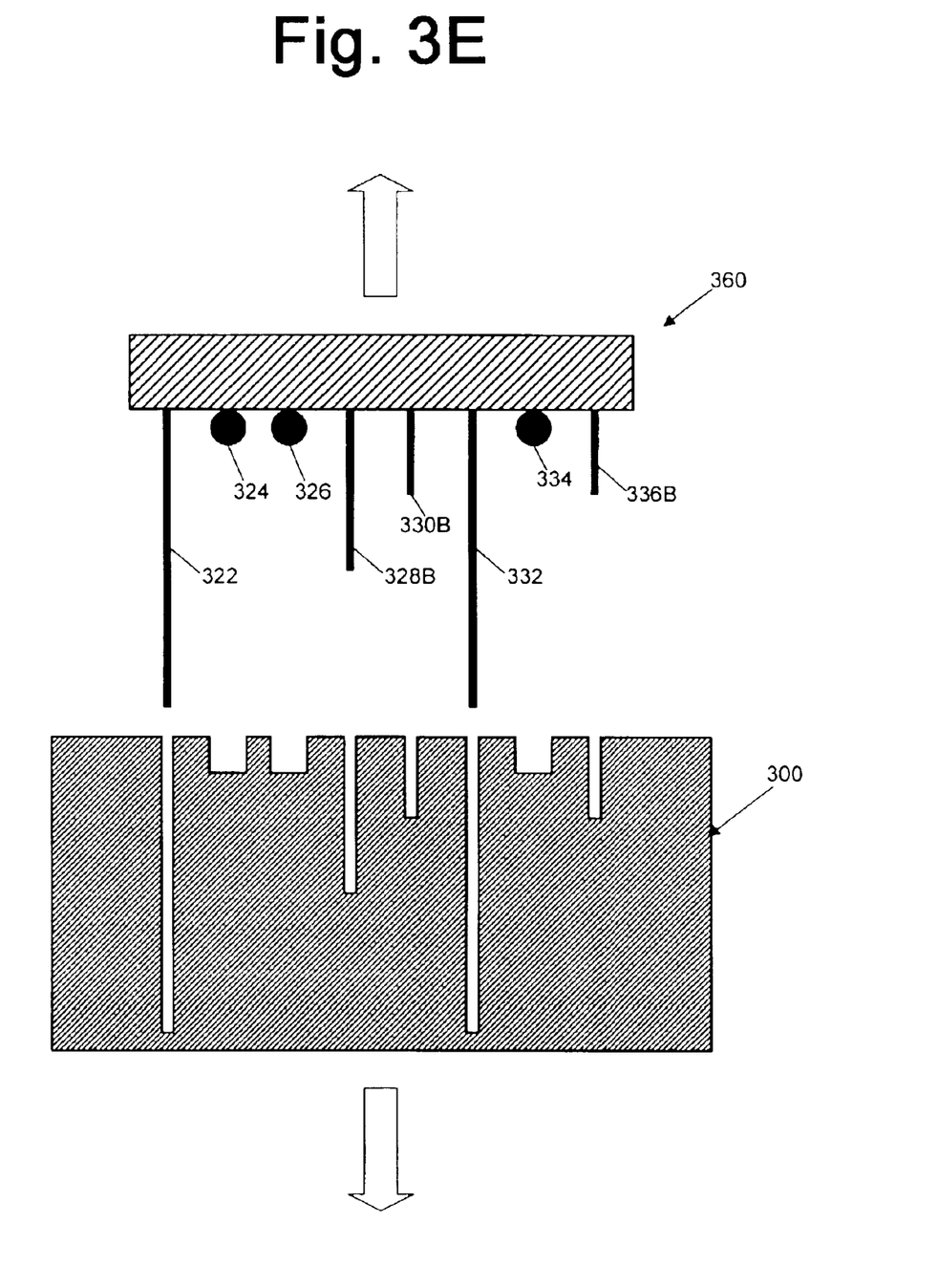
FIG. 3E is a schematic diagram illustrating a cross-section view of an exemplary package resulting from the exemplary technique of FIGS. 3A–3D in accordance with at least one embodiment of the present invention.

As shown in FIG. 3E, a resulting package 360 comprising the package body 350 and pins/pin segments 322, 324, 326, 328B, 330B, 332, 334 and 336B may be extracted from the fixture 300 and utilized in a PCB (e.g., PCB 110) having vias/contact pads compatible with the pins of the package 360. The fixture 300 then may be reused to form another package 360.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for implementing a circuit component on a surface of a multilayer circuit board, the method comprising the steps of:

providing the multilayer circuit board having a plurality of electrically conductive vias penetrating layers of the multilayer circuit board and being arranged so as to form at least one channel for routing one or more traces at one or more signal layers of the multilayer circuit board beneath at least one of the plurality of electrically conductive vias; and providing the circuit component having a plurality of pins, wherein at least one pin of the plurality of pins has a length that is formed to coincide with a depth of a corresponding via of the multilayer circuit board.

2. The method as in claim 1, further comprising the step of:

joining the circuit component to the surface of the multilayer circuit board, wherein each pin of a subset of the plurality of pins extends into and is in electrical contact with a corresponding via of the multilayer circuit board.

3. The method as in claim 1, wherein the circuit component includes a pre-existing component having a pin with a length greater than the depth of a corresponding via, and wherein the pin has a length that is formed to coincide with the depth of the corresponding via by trimming the pin to a length no greater than the depth of the corresponding via.

4. The method as in claim 1, wherein the circuit component includes a circuit component that is fabricated specifically for use with the multilayer circuit board.

5. The method as in claim 4, wherein the at least one pin is formed to have a length that coincides with the depth of a corresponding via according to the further method steps of:

inserting a plurality of pins into corresponding openings in a fixture, the openings having depths equivalent to corresponding vias of the multilayer circuit board, and wherein a portion of one or more of the plurality of pins extends above a surface of the fixture;

removing the portion of the one or more pins that extends above the surface of the fixture, wherein a remaining portion of each of the one or more pins has a length substantially equivalent to the depth of the corresponding opening; and electrically connecting each remaining portion of the one or more pins to a corresponding input or output of the circuit component.

6. The method as in claim 1, wherein each of a subset of the plurality of pins includes one of the group consisting of: a straight pin, a metal dendrite, a column, and a ball.

7. The method as in claim 1, wherein the plurality of pins includes a combination of the group consisting of: a straight pin, a metal dendrite, a column, and a ball.

* * * * *